(12) United States Patent
Coleman et al.

(10) Patent No.: US 8,804,787 B1
(45) Date of Patent: Aug. 12, 2014

(54) NARROW LINEWIDTH SEMICONDUCTOR LASER

(71) Applicant: Gooch and Housego PLC, Ilminster (GB)

(72) Inventors: Steven Michael Coleman, Bedford, NH (US); Alexander Rosiewicz, Stow, MA (US)

(73) Assignee: Gooch and Housego PLC, Somerset (GB)

( * ) Notice: Subject to any disclaimer, the term of this patent is extended or adjusted under 35 U.S.C. 154(b) by 0 days.

(21) Appl. No.: 13/965,542

(22) Filed: Aug. 13, 2013

(51) Int. Cl.
*H01S 3/08* (2006.01)

(52) U.S. Cl.
USPC ............... 372/99; 372/98; 372/108; 372/30; 372/25; 372/6

(58) Field of Classification Search
USPC .............................. 372/99, 98, 108, 30, 25, 6
See application file for complete search history.

(56) References Cited

U.S. PATENT DOCUMENTS

| | | | |
|---|---|---|---|
| 7,471,710 B2 | 12/2008 | Cliche et al. | |
| 2003/0058899 A1* | 3/2003 | Islam | 372/6 |
| 2008/0298402 A1* | 12/2008 | Rossi et al. | 372/20 |

OTHER PUBLICATIONS

Joseph M. Singley, et al., "Characterization of Lasers for Use in Analog Photonic Links", Naval Research Laboratory, Washington, D.C., Nov. 22, 2011.
"Optical Feedback in Photodigm's Laser Diodes—Application Note", White Paper, Photodigm, Inc., Richardson, TX, Apr. 1, 2009.

* cited by examiner

*Primary Examiner* — Kinam Park
(74) *Attorney, Agent, or Firm* — Jetter & Associates, P.A.

(57) ABSTRACT

A laser system includes a semiconductor laser having a laser driver coupled thereto. An output of the semiconductor laser is optically coupled to an input of an optical splitter that provides outputs including or coupled to a first branch having a first branch fiber coupled to a feedback reflector which provides a cavity boundary that defines a passive secondary cavity for the semiconductor laser, and a second branch including a back reflection reduction device. The roundtrip attenuation from an output facet of the laser to the feedback reflector is from −30 dB to −80 dB. The laser driver provides sufficient drive stability so that a frequency variation of the semiconductor laser is less than one free spectral range (FSR) of the secondary cavity. An output of said system is taken after the back reflection reduction device.

20 Claims, 12 Drawing Sheets

NARROW LINEWIDTH SEMICONDUCTOR LASER

FIELD

Disclosed embodiments relate to narrow linewidth semiconductor lasers.

BACKGROUND

Narrow linewidth (low phase noise) lasers are used in a wide range of applications including coherent communication, atomic spectroscopy and a variety of sensors including acoustic sensors. Conventional narrow linewidth lasers employ a range of approaches to achieve line narrowing. Most of these approaches require the alignment of extended cavities to the gain medium of the laser or the formation of other extended cavities in the form of ring cavities. An alternate approach is to employ a fiber laser where the extended cavity is provided by the fiber itself.

In the case of mechanically aligned external cavity lasers, the lasers are both expensive to build and inherently unstable due to mechanical misalignment sensitivity. In the case of the fiber laser, the laser is large in size and expensive due to the configuration of a doped fiber being pumped with a primary laser resulting in significantly reduced efficiency. In both types of lasers the feedback element typically possesses a sharp spectral feature to provide spectral selectivity beyond that of the cavity resonance (e.g., a free-space Littrow grating or fiber Bragg grating.) These known narrow linewidth laser solutions require a relatively high level of optical feedback from the external cavity (typically >10 dB roundtrip attenuation) and a precisely controlled external cavity length.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include semiconductor lasers having a laser driver where the output of the laser is optically coupled to an input of an optical splitter which provides outputs including or coupled to a first branch and a second branch. The first branch provides disclosed feedback optics including a first fiber coupled to a feedback reflector that provides a cavity boundary. The roundtrip attenuation from the output facet of the laser to the feedback reflector ranges from −30 dB to −80 dB. When combined with the front facet of the primary laser cavity, the additional feedback reflector defines a second coupled passive cavity (secondary cavity) that is in addition to that of the primary semiconductor laser cavity. The second branch includes a back reflection reduction device, beyond which the laser output is taken.

The laser driver provides sufficient drive stability so that the frequency variation of the semiconductor laser is such that the absolute line position of the unlocked semiconductor laser varies by less than a free spectral range (FSR) of the secondary cavity. The laser driver can be an electrical driver or an optical driver.

In disclosed coupled-cavity lasers there is no need to control the optical path length (OPL) of first branch (secondary passive cavity) during laser system operations. Thus, the OPL may vary during operation, such as due to temperature/acoustic fluctuations. Therefore, the phase of the coherent feedback (measured relative to a fixed operating frequency) provided by the first branch to the semiconductor laser is allowed to vary due to ambient fluctuations. It has been unexpectedly found that an uncontrolled OPL to the back reflection provided by the first branch provides significant spectral narrowing, which can be several orders of magnitude of narrowing.

A mechanism is described below that is believed to explain the observed line narrowing provided by disclosed laser systems to <10 kHz, believed to be made possible when the laser driver provides sufficient drive stability so that a frequency variation of the semiconductor laser absolute line position is less than one FSR of the secondary cavity, and a −30 dB to −80 dB roundtrip back-reflection attenuation from the output facet of the laser to the feedback reflector is configured to provide a sufficient coherent feedback level to the semiconductor laser to narrow the linewidth. Although this mechanism is believed to be accurate, disclosed embodiments may be practiced independent of the particular mechanism(s) that may be operable.

The relatively slowly varying coherent feedback phase due to the uncontrolled cavity length (relative to a fixed oscillating freq of many THz (e.g., ~193.4 THz)) has been found to shift the absolute (center) oscillating frequency of the laser off the gain peak established by the semiconductor laser and associated driver in the presence of no feedback (referred to in this Disclosure as the "unlocked" state). The slow variation in absolute phase introduced by the uncontrolled coupled cavity length is accommodated by a slight destabilization of the laser oscillating frequency to within 1 FSR of the secondary cavity. The FSR of the secondary cavity is typically of the order of 15 MHz compared to the unlocked operating frequency of the free running laser, which is typically of the order of 190 THz. In other words, the oscillating frequency of the narrowed laser is destabilized from the free-running (unlocked) state by up to 1 FSR of the secondary passive cavity. This effect therefore slightly moves the absolute laser line position, by allowing it to slowly vary with ambient perturbations (e.g., temperature changing the OPL of the secondary cavity), in exchange for significant spectral narrowing.

BRIEF DESCRIPTION OF THE DRAWINGS

Reference will now be made to the accompanying drawings, which are not necessarily drawn to scale, wherein.

unlocked EM650 (without disclosed feedback optics), the same EM650 locked (with disclosed feedback optics), and the same measurement made on two other COTS lasers.

Figure 5A:
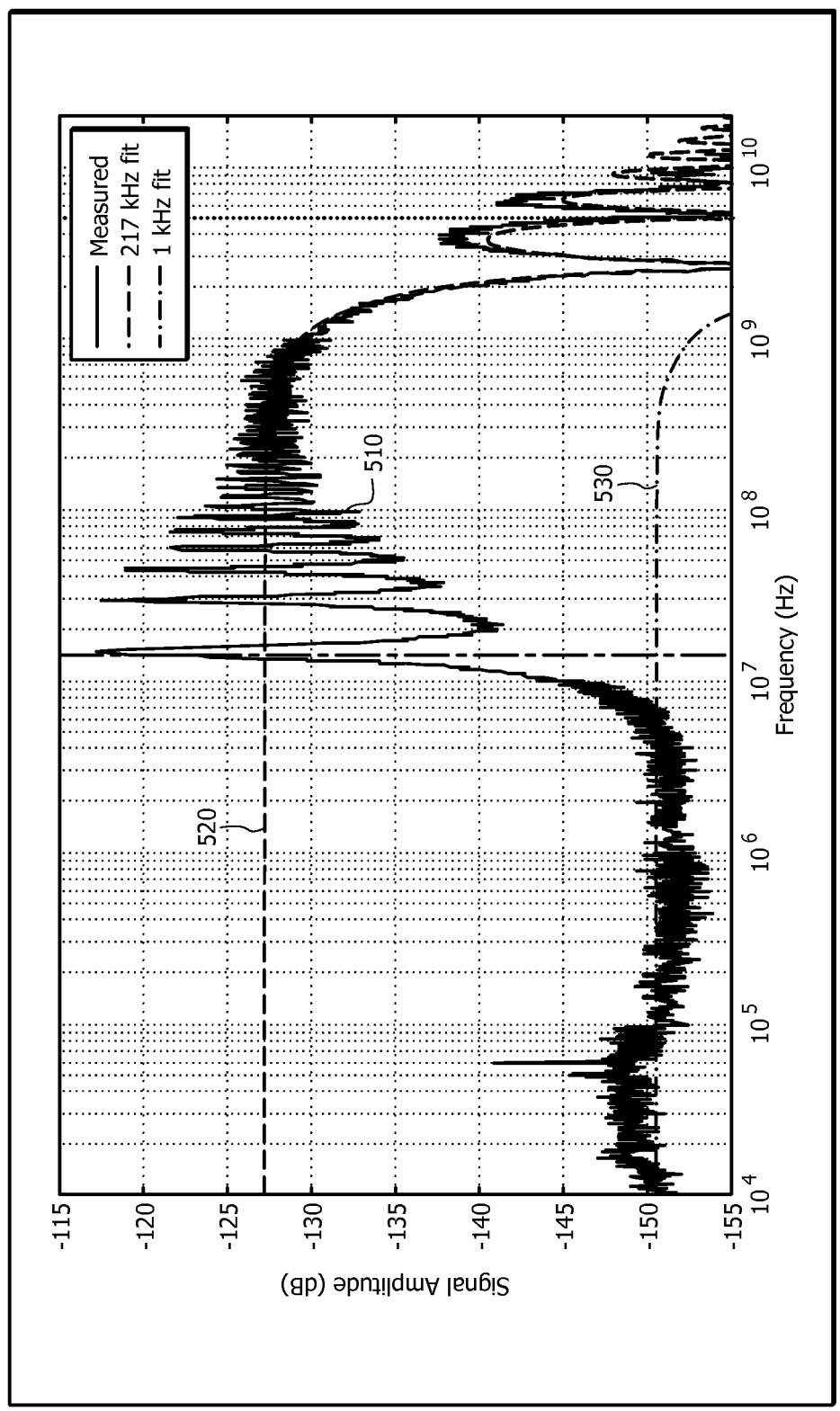
Figure 5B:
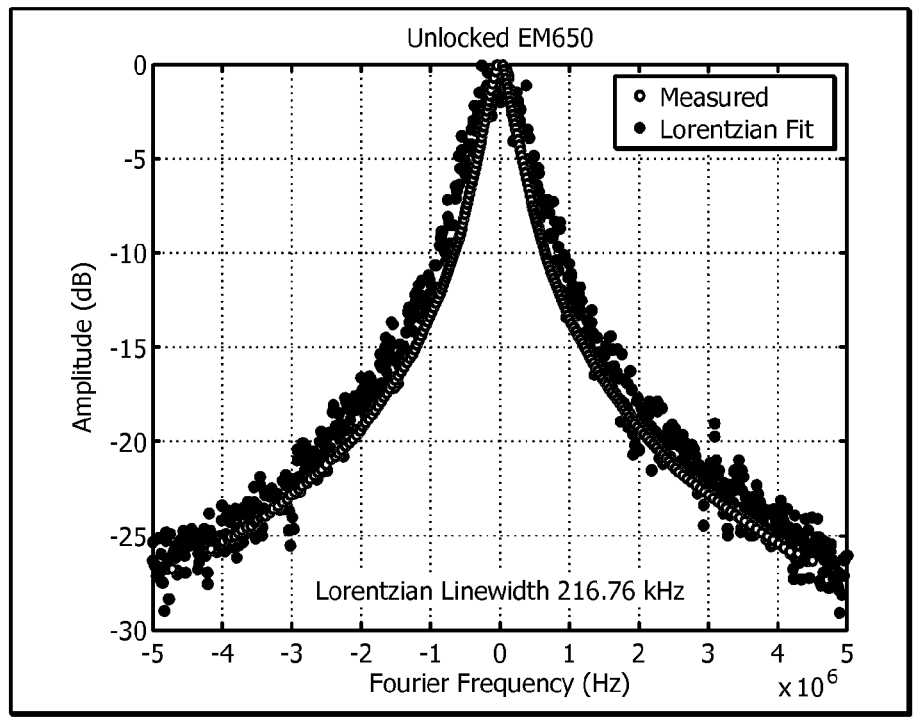
Figure 5C:
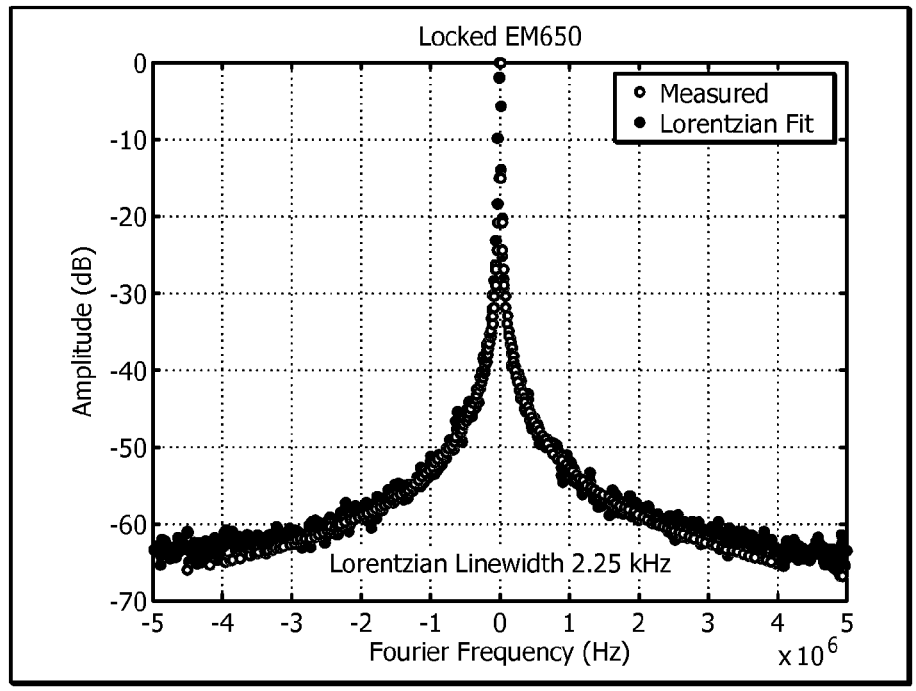

FIGS. 5A-C show results from experiments performed on a laser device with and without disclosed feedback optics. Intensity noise (converted from phase noise using a short interferometer) and linewidth were measured, which provides empirical evidence that phase noise (noise contributing to linewidth) is reduced by the disclosed feedback optics for frequencies below 1 FSR.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1A:
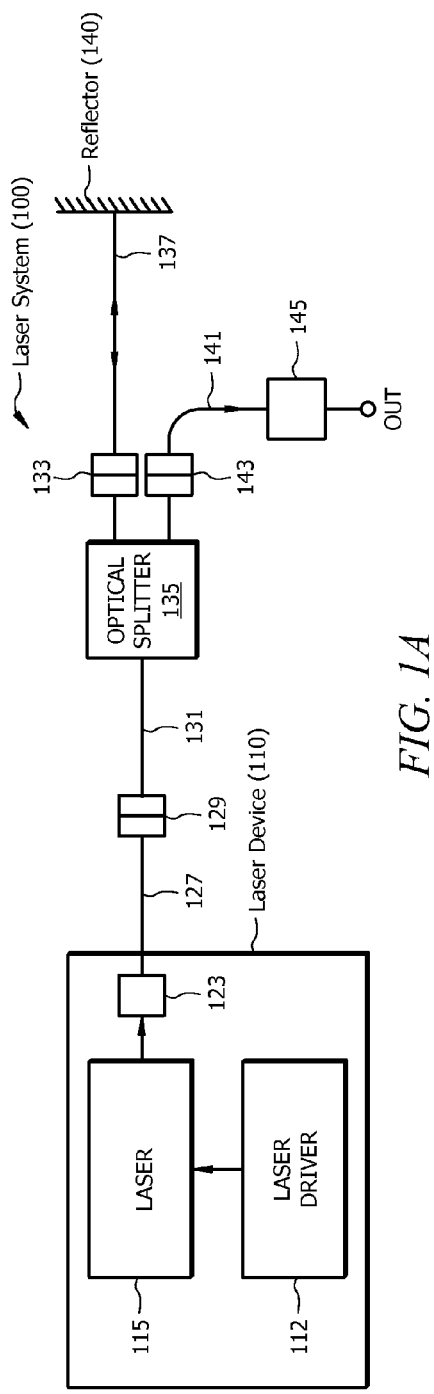
FIG. 1A shows a schematic representation of an example semiconductor laser system having disclosed feedback optics, according to example embodiment.

FIG. 1A shows a schematic representation of an example narrow linewidth semiconductor laser system 100 having disclosed feedback optics according to example embodiment. System 100 includes a laser device 110 comprising a semiconductor laser 115 having a laser driver 112 coupled thereto. As used herein, a semiconductor laser refers to a laser having a semiconductor gain medium which can be pumped either electrically or optically. In one embodiment the semiconductor laser is a Distributed Feedback (DFB) or a Distributed Bragg Reflector (DBR) laser.

The output of the semiconductor laser 115 is optically coupled to coupling optics 123 then to a single-mode (SM) optical output fiber 127. The coupling optics 123 include a combination of lenses and can include an optical isolator that typically provides ~30 dB of attenuation. The total attenuation used to generate the linewidth narrowing can then be a combination of the optical isolator's attenuation and external attenuation provided primarily by the first branch fiber 137. The output of the laser device 110 is shown conveyed by an output fiber 127. In one embodiment the semiconductor laser 115 is a fiber coupled DFB or DBR laser chip/die. Output fiber 127 is coupled by connector/fusion splice 129 to fiber 131 which provides an input to an optical splitter shown as a fiber optic splitter 135. Fiber optic splitter 135 can optionally comprise a fused device.

The respective fibers (127, 131, as well as 137 and 141 described below) and connector/fusion splice 129 can be in any combination of polarization maintaining (PM) and non-polarization maintaining depending on user' requirements. For example, they can all be PM if the user desires an output with predetermined polarization alignment. The fiber optic splitter 135 provides outputs including a first branch having a connector/fusion splice 133 coupled to a first branch fiber 137 coupled to a feedback reflector 140 which provides a cavity boundary that defines a secondary cavity to the semiconductor laser 115, and a second branch. The second branch includes a connector/fusion splice 143 coupled to a second branch fiber 141 coupled to a back reflection reduction device 145. The split provided by fiber optic splitter 135 can be roughly equal (50/50), or highly unequal, such as a 90/10 or a 10/90 split in some specific examples. Although shown as a "1×2" splitter, with one input and two outputs, a commercially available variation is a "2×2" splitter which has a second input. Either type may be used, and any N×M coupler/splitter may be used in principle.

Feedback reflector 140 can be implemented with a variety of reflective structures. Simple reflective structures include cleaving the fiber or terminating with a flat polished connector. A flat cleaved silica fiber provides about a 4% reflectivity to air. The OPL of the first branch fiber 137 is generally >0.5 m, typically being between 0.5 m and 50 m, such as 0.5 to 10 m. A roundtrip attenuation from an output facet of the semiconductor laser 115 to the feedback reflector 140 is from −30 dB to −80 dB, such as from −45 dB to −65 dB.

The relatively long OPL of the first branch from first branch fiber 137 provides a low FSR, typically in the 1-100 MHz range. The back reflection reduction device 145 can comprise an angled fiber connection/termination or an optical isolator that generally limits an amplitude of back reflected light to <−30 dB. In some embodiments the back reflection preventer is a 1.5 stage isolator providing >40 dB isolation or a double stage isolator providing isolation >55 dB. A double stage isolator can essentially eliminate possible instabilities from unintended optical feedback from the second branch. The laser driver 112 provides sufficient drive stability so that a frequency variation of the semiconductor laser 115 is less than one FSR of the secondary passive cavity. An output of the system 100 is taken after the back reflection reduction device 145. Disclosed laser systems such as system 100 meet the market need for a low-cost, easily manufactured and robust narrow linewidth lasers.

Figure 1B:
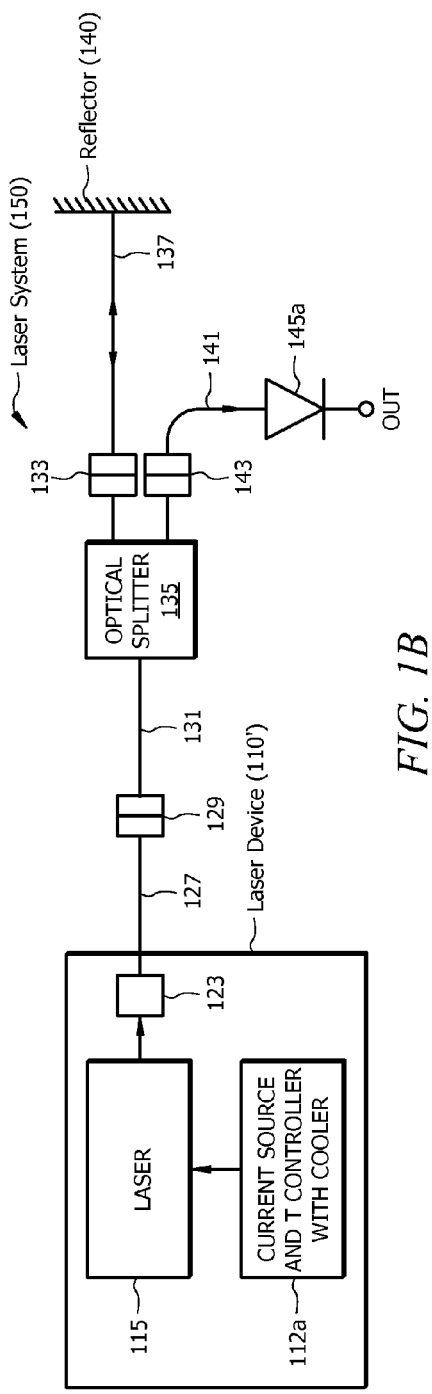
FIG. 1B shows a schematic representation of another example semiconductor laser system having disclosed feedback optics, according to example embodiment.

FIG. 1B shows a schematic representation of another example semiconductor laser system 150 including a laser device 110' having disclosed feedback optics, according to example embodiment. In this embodiment, the laser device 110' includes a laser controller 112a including a current driver or a voltage driver and temperature controller including a cooler (e.g., a thermoelectric cooler) coupled thereto.

In one particular embodiment the laser device 110' comprises the EM650 laser device from Gooch & Housego PLC that integrates a high-power fiber-coupled DFB laser with both an ultra-low noise laser current source and temperature controller. The EM650 laser device includes a high-power DFB laser, optical isolator, SM fiber pigtail for the output fiber 127, thermo-electric cooler, thermistor, and monitor detector integrated with a laser current source, temperature controller, and monitor detector readout amplifier.

The output of the semiconductor laser 115 is optically coupled to SM optical output fiber 127 by coupling optics 123. The laser output conveyed by output fiber 127 is fiber coupled to connector/fusion splice 129 to fiber 131 then to a fiber optic splitter 135. As with system 100, fiber optic splitter 135 provides outputs including a first branch including first branch fiber 137 coupled to a feedback reflector 140 and a second branch includes a second branch fiber 141. The second branch fiber 141 is coupled to an optical isolator 145a, that can comprise a double stage isolator providing isolation >55 dB.

Regarding the stability of the electronics in the current driver or voltage driver of laser controller 112a, although the general rule noted above is the laser driver provides sufficient drive stability so that a frequency variation of the semiconductor laser is less than a FSR of the secondary passive cavity, one example limit can be that over the measurement period (such as 8 s) the frequency stability of the laser driver plus temperature control electronics of controller 112a should be such that the absolute line position of the semiconductor laser 115 should vary by no more than $\sim <\frac{1}{10}^{th}$ (e.g., 3 to 30%) of the FSR of the secondary cavity. For example, the EM600 laser device provided by Gooch & Housego PLC varies by roughly 0.7 FSRs for a 6.7 m OPL cavity (10.5 MHz). The EM650 laser device provided by Gooch & Housego PLC varies by approximately 2.1 MHz over the same period.

As noted above, the OPL of the first branch can be uncontrolled and thus be arbitrary, and thus need not have any relation to the operating wavelength. However, the FSR spacing of the passive cavity (determined by the OPL of the first branch) does determine the absolute line position stability that is achieved for short periods. This is evidenced in heterodyne signals by the repeated drift-then-snap behavior of the difference signal (see FIGS. 2A-F described below). An approximate calculation for a 6 m OPL first branch fiber 137 comprised of silica results in 2 μl radians per 0.1° C.

Disclosed embodiments include polarization maintaining (PM) or non-Polarization Maintaining SM fiber for the first branch and/or fiber optic splitter 135. A mixed PM first branch and non-PM splitter can also be employed. The laser can comprise a single longitudinal mode (SLM) laser die, and include an optical isolator before the fiber optic splitter 135.

Figure 1C:
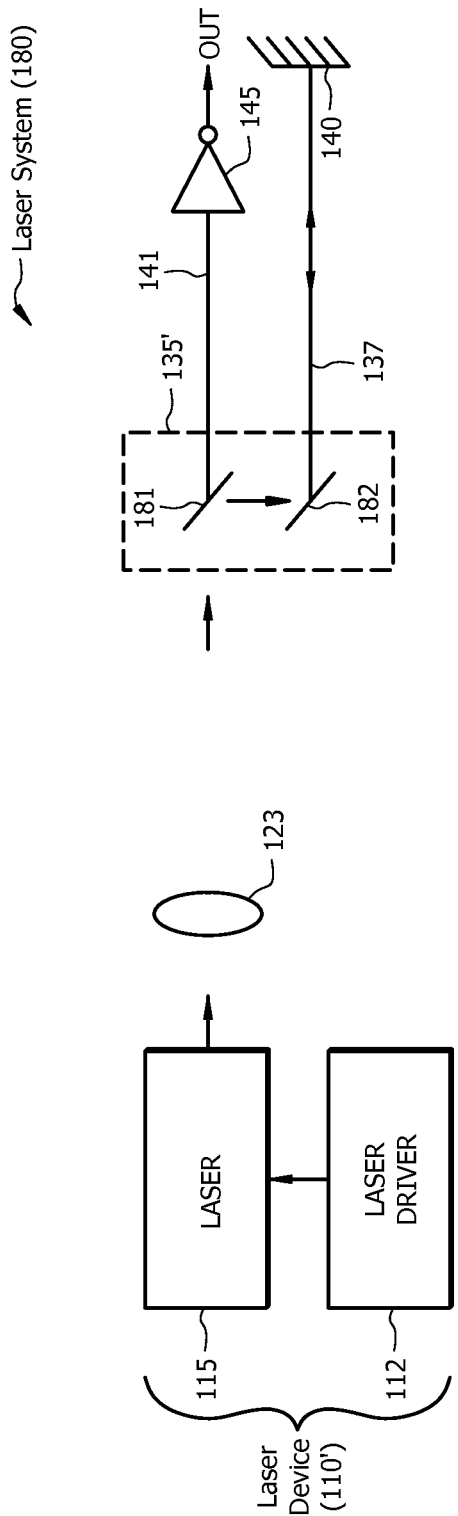
FIG. 1C shows a schematic representation of another example semiconductor laser system in a hybrid (partially free-space) configuration having disclosed feedback optics, according to example embodiment.
Figure 2A:
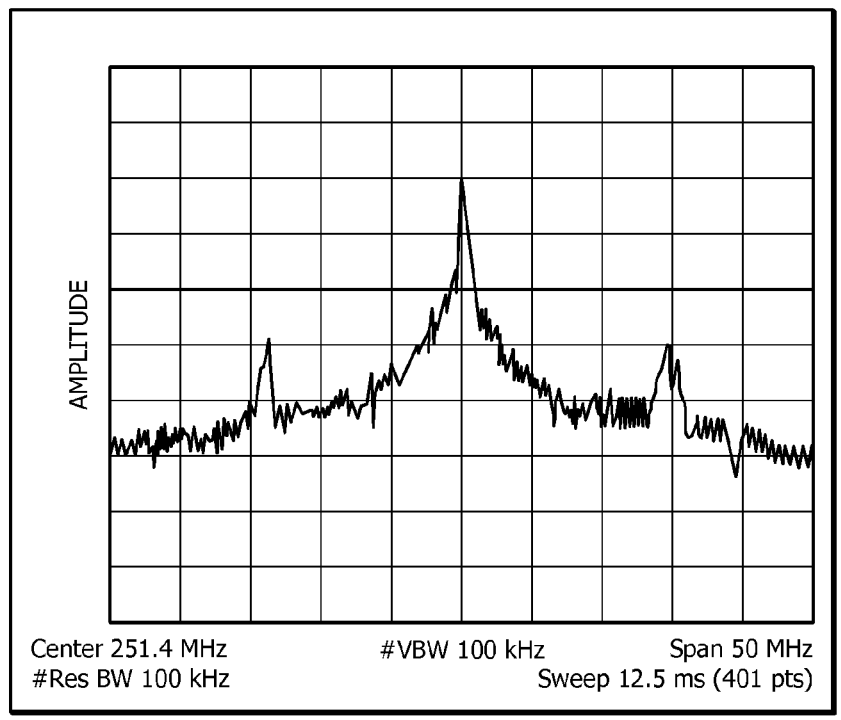
FIGS. 2A-F show optical heterodyne measurements between a stable commercial off the shelf (COTS) laser and a disclosed laser system having disclosed feedback optics at 1 s, 4 s, 6 s, 8 s−, 8 s+ and 12 s, respectively.
Figure 2B:
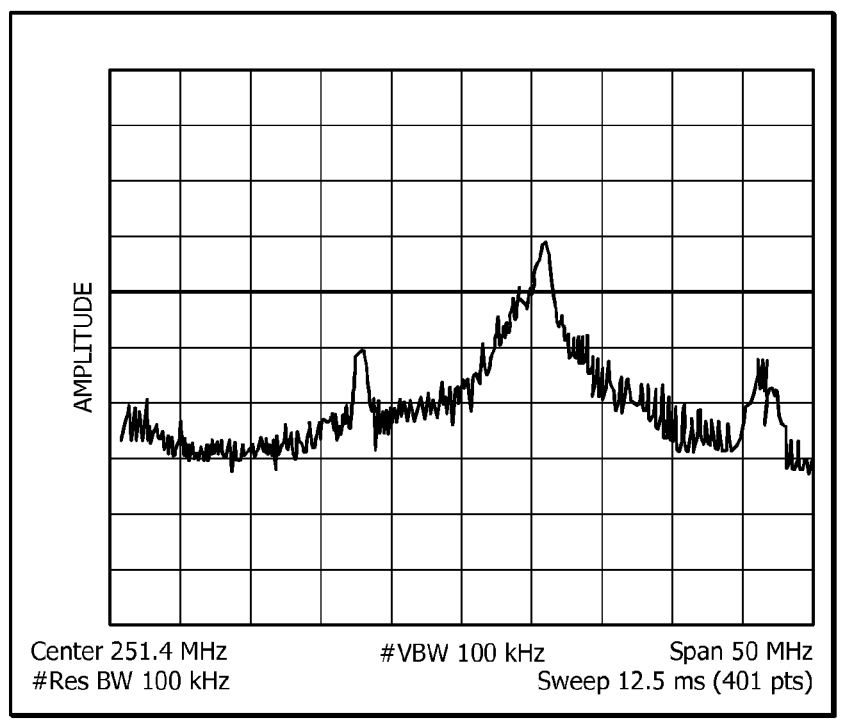
Figure 2C:
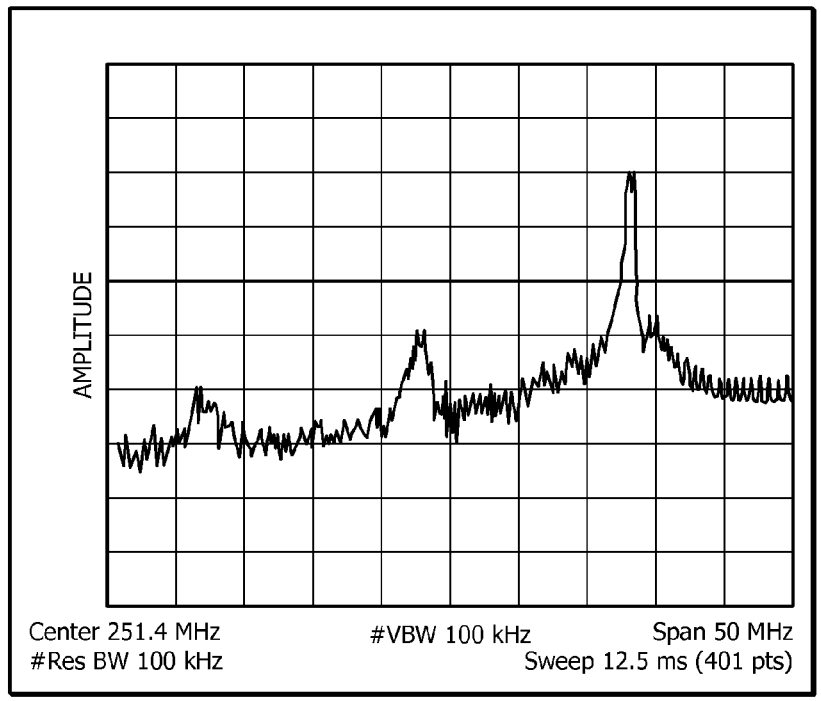
Figure 2D:
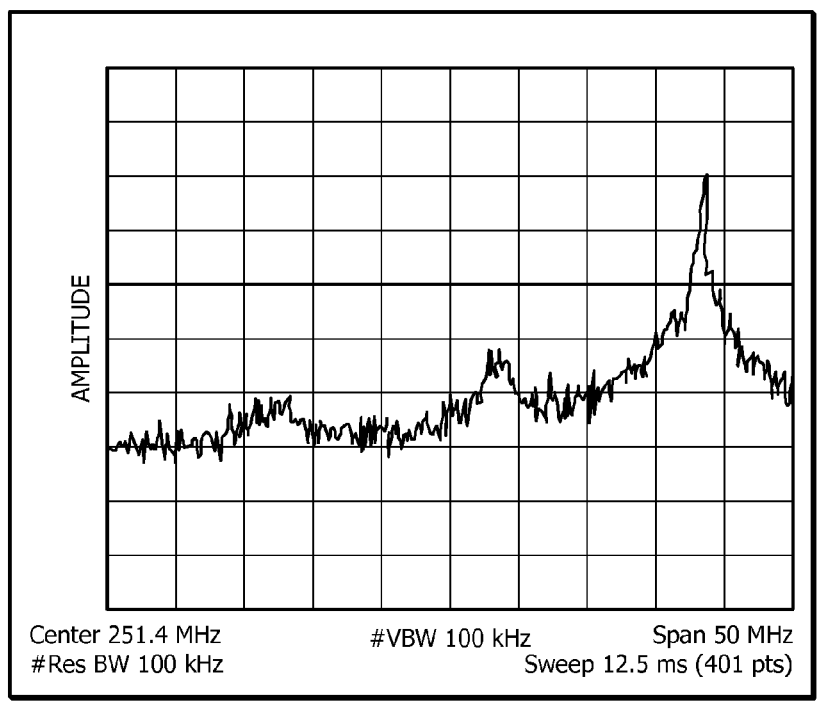
Figure 2E:
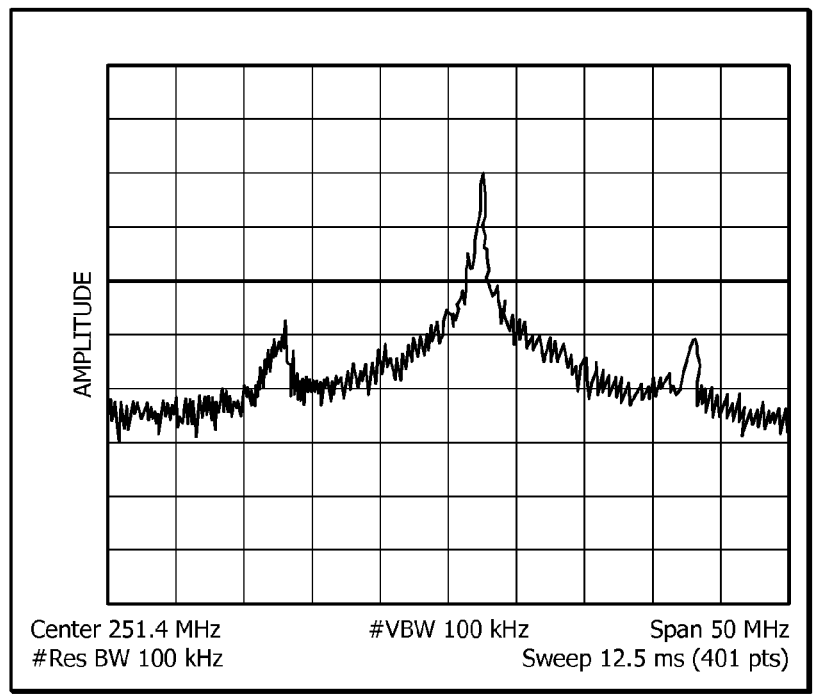
Figure 2F:
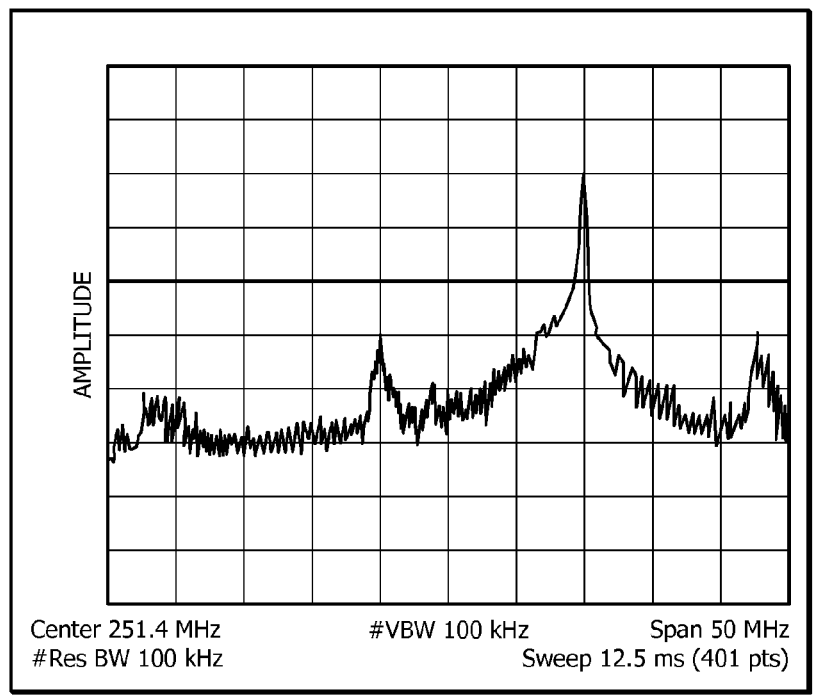

FIG. 1C shows a schematic representation of another example semiconductor laser system 180 in a hybrid (partially free-space) configuration having disclosed feedback optics, according to example embodiment. In this embodiment the coupling optics 123 is a lens for directing light from the output of the semiconductor laser 115, and the optical splitter 135' comprises a first partially reflecting minor 181 and a second partially reflecting mirror 182. Light transmitted by first partially reflecting mirror 181 is coupled to second branch fiber 141 which couples light to back reflection reduction device 145 shown as an optical isolator. An output of the system 180 is taken after the back reflection reduction device 145, which can be a free space or a fiber output. Light reflected by first partially reflecting mirror 181 is coupled to second partially reflecting minor 182 which couples light via the first branch fiber 137 to the feedback reflector 140.

In one particular embodiment, first partially reflecting mirror 181 provides about 6% reflection at an angle of incidence of 65°, while second partially reflecting mirror 182 provides about 4% reflection, and the optical isolator provides >80 dB of isolation. In this particular embodiment, the round trip attenuation from the output facet of the semiconductor laser 115 to the feedback reflector 140 can be about −56 dB.

Disclosed embodiments also include all free-space configurations. In an all free-space (fiber less) configuration, the first branch fiber 137 and second branch fiber 141 are replaced by free-space links.

Advantages of disclosed laser system embodiments include a narrow laser linewidth (e.g., <10 kHz) by providing a laser driver that controls the frequency variation of the semiconductor laser to be less than a FSR of the secondary passive cavity. There is no need for the secondary cavity length to be controlled, but low-frequency laser performance does improve if temperature or acoustically induced OPL changes are kept to a minimum such that the induced frequency cycling is minimized. Assuming largely wavelength independent back reflection (relative to the gain bandwidth of the lasing material) is also provided, for instance by using the Fresnel reflection of silica/air or a broad band metal reflector such as gold, the laser may be operated with a large tuning range (~>200 GHz). Tuning may be achieved via temperature (e.g. by using the thermoelectric cooler on which the laser diode is mounted to change the die temperature), or by changing the drive current of the laser diode itself, often called "chirping".

The laser RIN resulting from the disclosed techniques are modestly compromised versions of the RIN of the unlocked laser. Typically the RIN values are kept below −150 dBc/Hz from 10 kHz to 40 GHz. Such RIN values are 10's of dB lower than those of competitive products as illustrated in FIG. 3. Disclosed laser systems also have a low cost architecture, and a higher operating output power (e.g., >70 mW) than generally all laser devices other than the solid-state ring laser, while providing a significantly lower power consumption with a smaller size compared to a comparable solid-state ring laser.

As described above, by providing an absolute (unlocked) laser line stability less than the secondary cavity FSR, and a low and stable level of feedback from the first branch, a narrow linewidth laser is realized. Applications for disclosed narrow-linewidth lasers include applications benefitting from a narrow linewidth that are generally tolerant of at least 1 FSR of absolute frequency jitter measured over a period of seconds which also do not require narrow line (low phase noise) performance at Fourier frequencies above 1 FSR, for example above 15 MHz. These applications include many types of sensors, e.g. fiber-optic sensors for strain and/or temperature, various types of interferometric sensing, trace gas detection with differential absorption LIDAR (DIAL), hydrophones, or wind speed measurements with Doppler LIDAR. Linewidths of only a few kilohertz are required for some fiber-optic sensors, whereas 100 kHz can be sufficient for, e.g., LIDAR measurements.

EXAMPLES

Disclosed embodiments are further illustrated by the following specific Examples, which should not be construed as limiting the scope or content of this Disclosure in any way.

For the experiments described below for disclosed locked laser systems having disclosed feedback optics and their unlocked controls, the gain peak/oscillating frequency of a free-running DFB laser was maintained by EM650 drive electronics over the short term (around 10 s) to ~<3 MHz. For disclosed locked laser systems the OPL of the first fiber during system operation was approximately 6.5 m and was uncontrolled allowing it to vary due to temperature/acoustic fluctuations. Thus, the phase of the coherent feedback (relative to a fixed operating frequency, e.g. 193.4 THz) was varied by ambient fluctuations. Data obtained evidenced the introduction of the back-reflection provides enough coherent feedback to narrow the laser linewidth from several hundred kHz to ~<10 kHz, and when an uncontrolled OPL back reflection was introduced as described above the relatively slowly varying feedback phase (relative to the oscillating freq of ~193.4 THz) was found to move the absolute frequency off of the gain peak by up to one secondary cavity FSR while providing significant spectral narrowing.

It was found from data taken from a laser system analogous to system 100 having disclosed feedback optics that having a total roundtrip attenuation from the output facet of the semiconductor laser 115 to the feedback reflector 140 between −35 dB and −65 dB allowed significant linewidth narrowing, with the narrowest linewidth occurring at roughly −45 dB all for an approximate OPL of 6.5 m. The basis for this calculation looked at the change of isolation of the isolator with wavelength and the experimental narrowed data collected from about 30 lasers. Data was obtained using a 90/10 vs. 10/90 split to the first branch. In those cases the first branch on the 10% arm showed no reduction while placing the first branch on the 90% arm resulted in slightly lower performance than a 50/50 split with the same first branch.

In another experiment, shown in FIGS. 2A-F, a sequence of scanned screenshots from images were obtained from optical heterodyne measurements from disclosed laser system 150 having disclosed feedback optics which include measurements at the output of system 150 at 1 s, 4 s, 6 s, 8 s−, 8 s+ and 12 s, respectively. The narrow peak is the difference frequency representing the line center of the disclosed laser system and the side peak spacing shown is set by the FSR of the secondary passive cavity. The amplitude of these peaks varies as a function of time and the amplitude of the back reflection, but can generally be limited to −30 db from the main oscillating peak. The linewidth of the laser used in FIGS. 2A-2F is ~5 kHz.

The center frequency can be seen to move to higher-frequencies with time until it nears the location of a side peak. When the oscillating frequency nears a side peak, the gain peak of the free running laser combines with the nearly pi increment in feedback phase such that the oscillating line "snaps back" to the free running value. (FIG. 2D before snapback and FIG. 2E after snapback returning essentially to the line position shown in FIG. 2A). The rate of this snapping back is dependent on the effects of ambient fluctuations on the cavity OPL and on the operating point of the free running laser. Throughout this entire period, the laser is operating as a narrow-line (~5 kHz) laser. The line narrowing is seen to induce small RIN spikes at FSR harmonics, which are 15 MHz in this particular case. Wavelength tuning was found to have no apparent affect on the linewidth, but during tuning the operating point will cycle as shown in FIG. 2A-F, which may limit the tuning rate in certain applications. The tuning range was found to be >120 GHz and in principle should coincide with that of the underlying laser, which can exceed 700 GHz for a DFB.

Figure 3A:
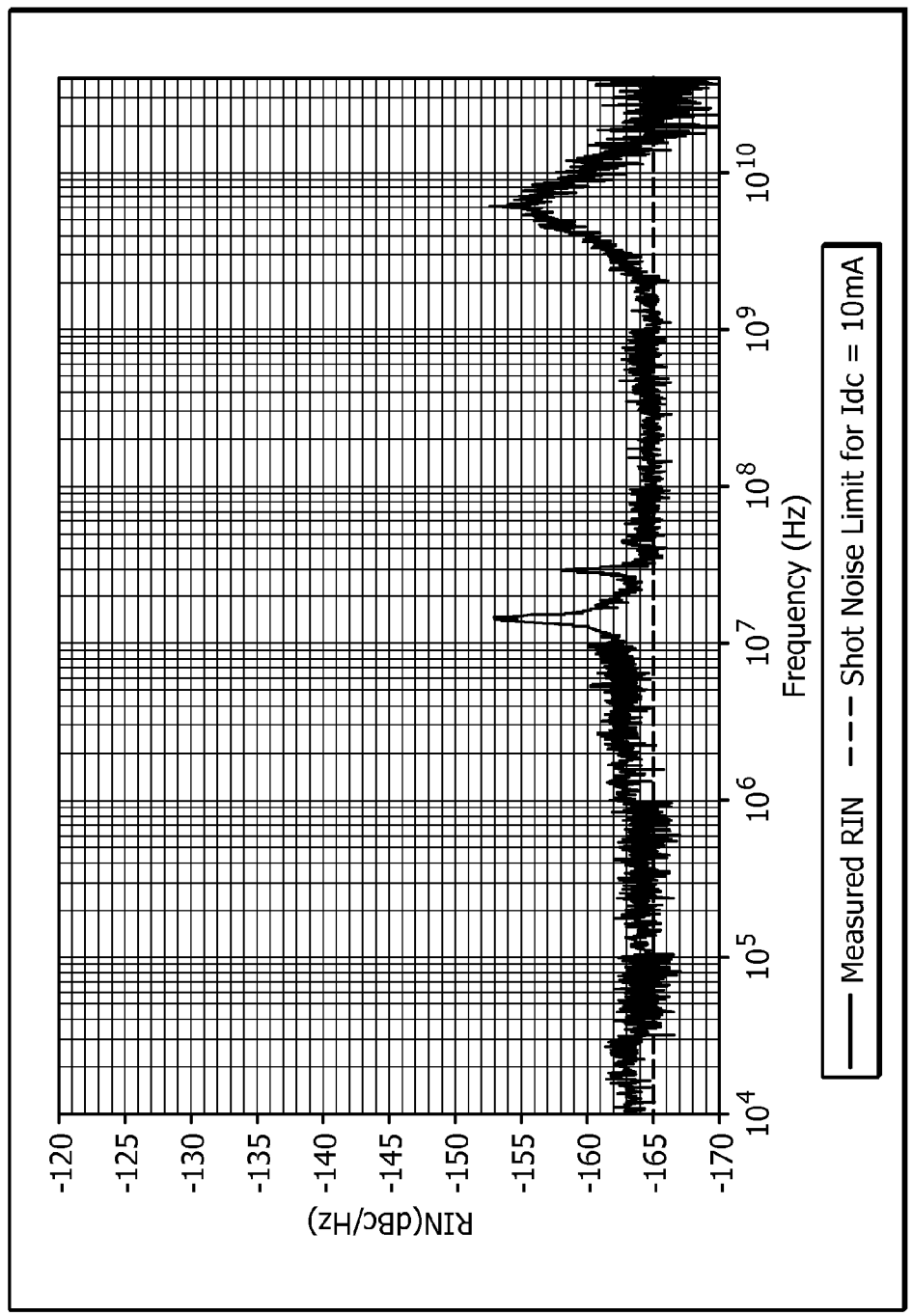
FIGS. 3A-3D shows a laser relative intensity noise (RIN) comparison, with FIG. 3A being the RIN from a disclosed laser system having disclosed feedback optics, with FIGS. 3B-3D showing the RIN from three different commercially available laser systems.
Figure 3B:
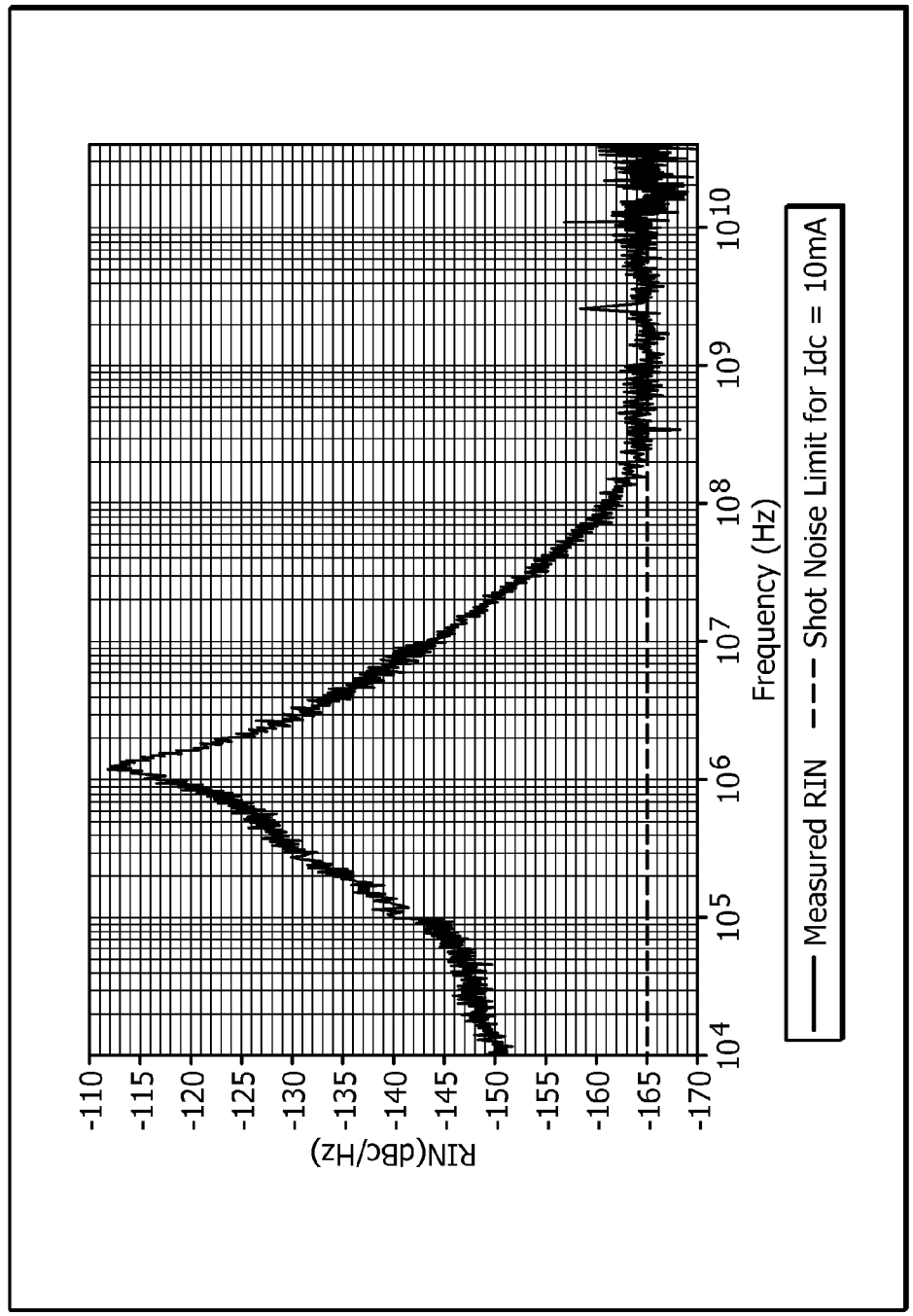
Figure 3C:
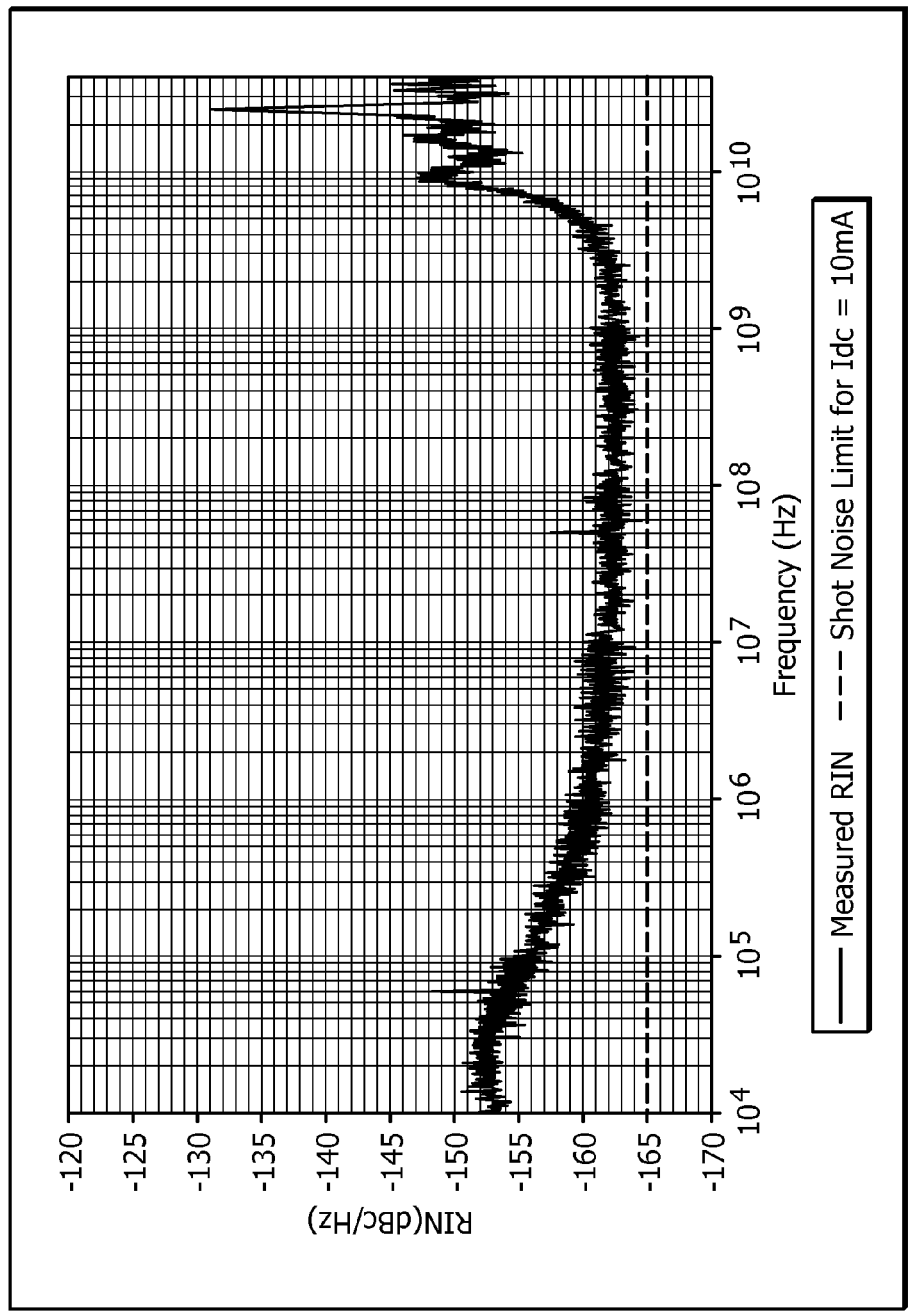
Figure 3D:
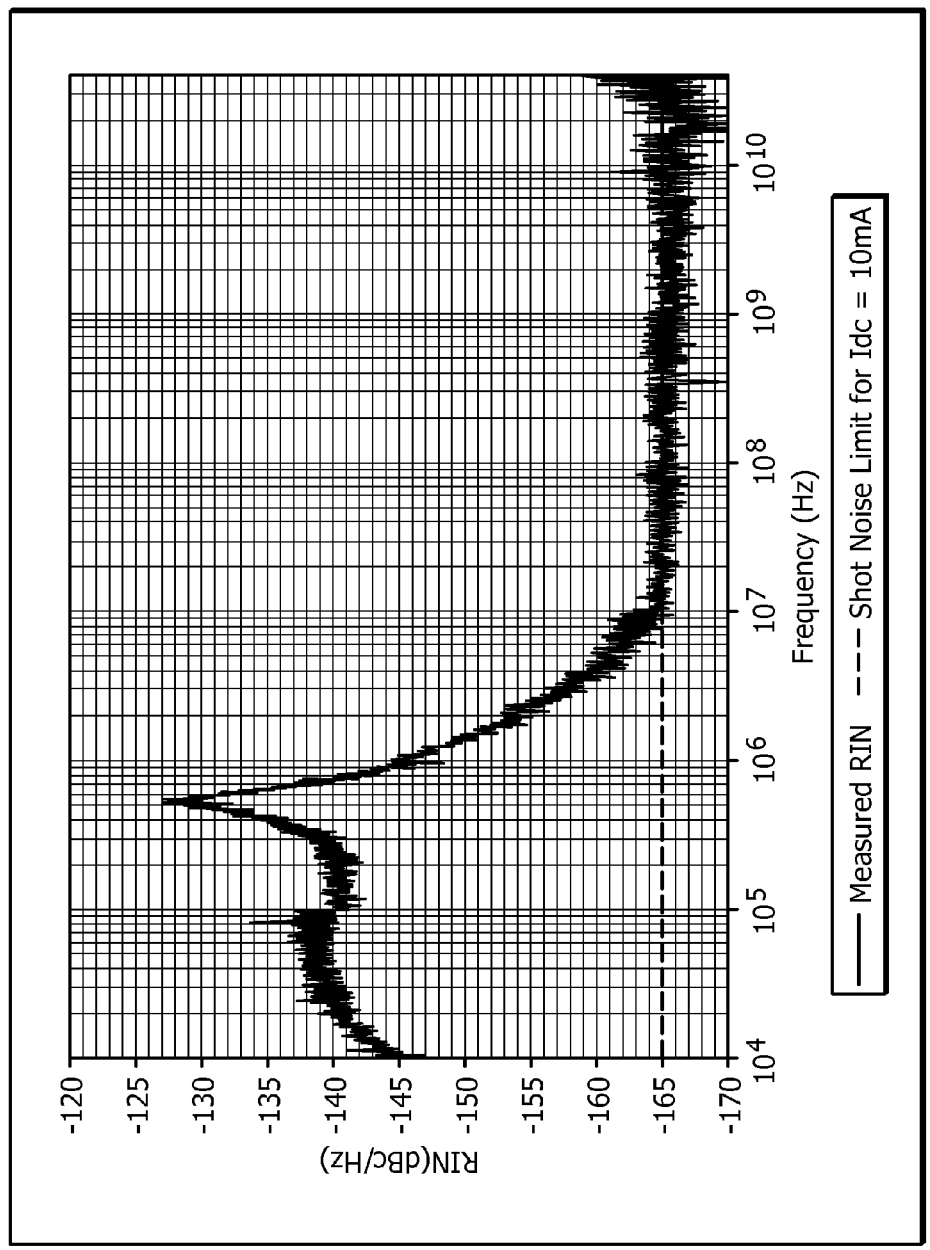

FIGS. 3A-3D shows RIN comparisons over a frequency range from 10 kHz to 40 GHz, with FIG. 3A being the RIN from a disclosed locked laser system based on the EM650 laser device, with FIGS. 3B-3D showing the higher RIN and differing spectra from three different commercially available narrow-linewidth laser systems as disclosed in a paper entitled "Characterization of Lasers for Use in Analog Photonic Links" by Singley et al generated by the Naval Research Laboratory dated Nov. 22, 2011. FIG. 3A shows the disclosed locked laser system operating at a linewidth of 3.6 kHz. A notable effect the disclosed narrowing technique has on RIN is to introduce low-amplitude spikes at harmonics of the first branch (feedback optical path, or secondary cavity) FSR. The number and strength (amplitude) of the harmonics is dependent on the level of feedback supplied to the laser.

FIG. 3B shows the RIN spectrum for an Er-doped fiber laser. Note the difference in vertical scale in FIG. 3B. This laser utilizes phosphate glass fibers in order to increase the erbium concentration thereby achieving higher gain in a shorter length which results in a more compact device. This laser system is accompanied by a separate control module that utilizes factory settings for both the temperature and drive current of the laser. The output power of this unit was nominally rated at 25 mW, however only 18.6 mW was measured.

FIG. 3C shows the RIN spectra for an external cavity semiconductor diode laser (ECDL). This laser incorporates a photonic bandgap (PBG) fiber that produces single-frequency output in a Telecordia-qualified 14-pin butterfly package. The laser's output power was 15.9 mW at 1550 nm. There are several large noise peaks in the range from 2 to 40 GHz. The relaxation oscillation peak occurs at 8.8 GHz with the other noise peaks resulting from additional longitudinal modes.

FIG. 3D shows the RIN spectra for a Nd:YAG ring oscillator laser, where the laser's output power was 200 mW at 1319 nm. The RIN spectrum of the Nd:YAG laser system is similar to Er-doped fiber laser described above relative to FIG. 3B with the exception of additional narrow noise peaks at 2.6 GHz and 10.9 GHz for the Er-doped fiber laser in FIG. 3B.

Figure 4A:
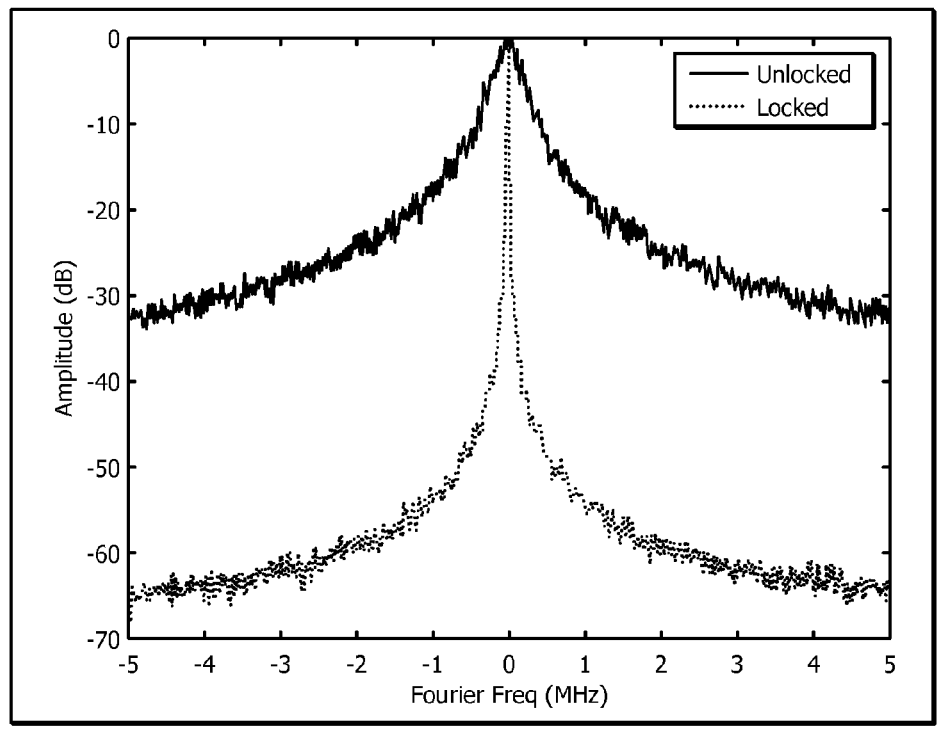
FIG. 4A shows narrowing of the laser line for an EM650 laser device from 118 kHz unlocked (without disclosed feedback optics) to 2 kHz locked (with disclosed feedback optics).

Further experiments where performed and the linewidth measured without disclosed feedback optics and with disclosed feedback optics. As shown in the amplitude (in dB) vs. freq data provided in FIG. 4A, the laser line for a EM650 laser device was narrowed from 118 kHz unlocked (without disclosed feedback optics) to 2 kHz locked (with disclosed feedback optics).

Figure 4B:
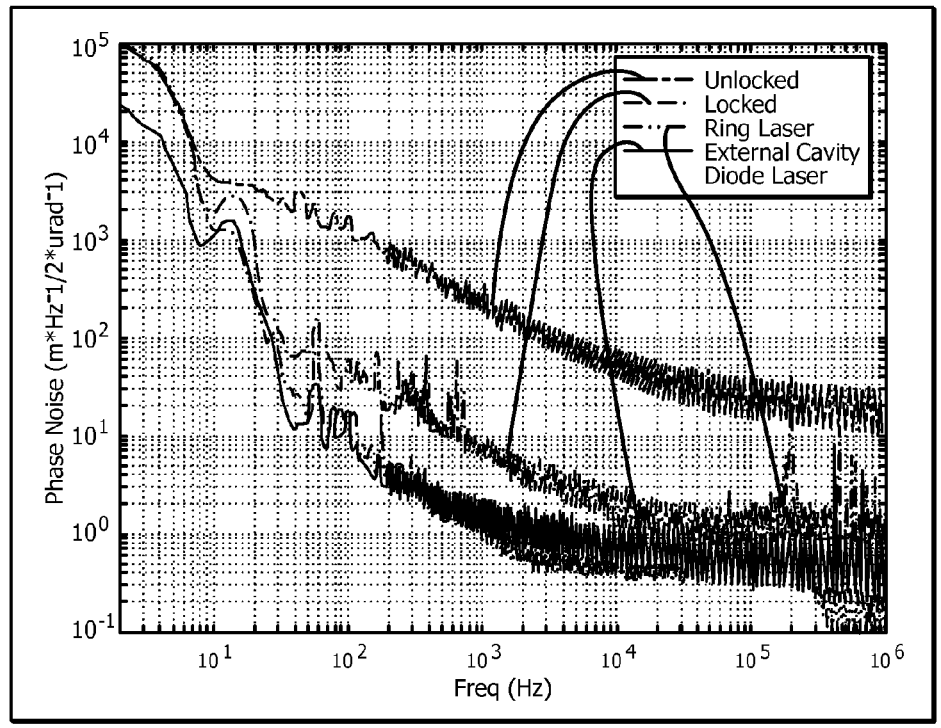
FIG. 4B shows comparative phase noise measurements as a function of frequency for a commercial off the shelf (COTS)

A corresponding measurement of linewidth is phase noise. Phase noise is a coherent frequency resolved measurement that can be used to characterize the performance of lasers. If phase noise is integrated over an appropriate frequency range, the result is the linewidth. FIG. 4B shows comparative phase noise measurements as a function of frequency for a COTS unlocked EM650 (without disclosed feedback optics), a locked EM650 (with disclosed feedback optics), and the same measurements made on two other COTS lasers being a ring laser and an external cavity diode laser which both generally provide low phase. FIG. 4B shows the frequency resolved effect of significantly reduced phase noise from 1 Hz to $10^6$ Hz between the locked EM650 and unlocked EM650.

Further experiments with measurements were performed on a DFB laser device with and without disclosed feedback optics and the high frequency phase noise and linewidth were measured in FIGS. 5A-C. The data described in this example provides empirical evidence that phase noise (noise contributing to linewidth) are reduced by the disclosed feedback optics for frequencies below 1 FSR. Disclosed feedback optics appear to significantly reduce the phase noise between harmonics of 1 FSR and increases the phase noise at those harmonics, but the main utility for disclosed lasers lies below the first harmonic, making the increases in the phase noise at the harmonics irrelevant for most applications.

In FIG. 5A, the line identified as 510 is the measurement of the RIN of the laser system with a short delay Mach-Zehnder interferometer in the optical path (this measurement may be considered to be a metric of high-frequency phase noise). The delay of this interferometer was 375 ps and is responsible for the nulls seen at harmonics of 2.67 GHz. These nulls were expected as described in the reference noted below. As a standard unlocked EM650 this laser device exhibited a measured linewidth of 217 kHz as shown in FIG. 5B. Using equation 4 disclosed in R. W. Tkach and A. R. Chraplyvy, "Phase Noise and Linewidth in an InGaAsP DFB Laser," Journal of Lightwave Technology, LT-4, No. 11, November 1986 the expected frequency response is plotted for a 217 kHz Lorentzian linewidth laser fit as the line 520 in FIG. 5A. The line 530 shown instead uses a 1 kHz linewidth fit.

For the laser device with disclosed feedback optics, the feedback was established using a first branch providing external secondary cavity with an FSR of 15 MHz, which is indicated by the dashed vertical line in FIG. 5A. It is noted that above one cavity FSR the laser behaves as would be expected for the underlying, unlocked laser. However, below one cavity FSR, the laser behaves as one would expect from a ~1 kHz Lorentzian linewidth DFB. With disclosed feedback optics, the laser exhibited a measured linewidth of 2.3 kHz as shown in FIG. 5C. The discrepancy between the two measurements of the narrow linewidth (<1FSR, 1 kHz vs. 2.3 kHz) are considered to be experimental error and the results of curve fitting to noisy data used in both measurements.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A laser system, comprising:
   a semiconductor laser having a laser driver coupled thereto;
   wherein an output of said semiconductor laser is optically coupled to an input of an optical splitter that provides outputs including or coupled to a first branch having a first branch fiber coupled to a feedback reflector which provides a cavity boundary that defines a passive secondary cavity for said semiconductor laser, and a second branch including a back reflection reduction device,
   wherein a roundtrip attenuation from an output facet of said semiconductor laser to said feedback reflector is from −30 dB to −80 dB;
   wherein said laser driver provides sufficient drive stability so that a frequency variation of said semiconductor laser is less than a free spectral range (FSR) of said secondary cavity, and
   wherein an output of said system is taken after said back reflection reduction device.

2. The system of claim 1, wherein said first branch provides an optical path length (OPL) of between 0.5 m and 50 m.

3. The system of claim 1, wherein said roundtrip attenuation is from −45 dB to −65 dB.

4. The system of claim 1, wherein said semiconductor laser comprises a single longitudinal mode (SLM) laser die, further comprising an optical isolator before said optical splitter.

5. The system of claim 1, wherein said semiconductor laser comprises a Distributed Feedback (DFB) laser or a Distributed Bragg Reflector (DBR) laser.

6. The system of claim 1, wherein said laser driver comprises a current source or voltage source that is part of a laser controller including a temperature controller and a cooler.

7. The system of claim 1, wherein said semiconductor laser is a fiber coupled laser coupled to an output fiber.

8. The system of claim 1, wherein said back reflection reduction device comprises an optical isolator.

9. The system of claim 1, wherein said semiconductor laser is a free space laser.

10. A method of narrowing a linewidth of a semiconductor laser, comprising:
    optically coupling an output of said semiconductor laser to an input of an optical splitter that provides outputs including or coupled to a first branch having a first branch fiber coupled to a feedback reflector which provides a cavity boundary that defines a passive secondary cavity for said semiconductor laser, and a second branch including a back reflection reduction device;
    wherein a roundtrip attenuation from an output facet of said semiconductor laser to said feedback reflector is from −30 dB to −80 dB, and
    driving said semiconductor laser with a laser driver which provides sufficient drive stability so that a frequency variation of said semiconductor laser is less than a free spectral range (FSR) of said secondary cavity.

11. The method of claim 10, wherein an optical path length (OPL) of said first branch is uncontrolled in any way.

12. The method of claim 10, wherein said linewidth is <10 kHz.

13. The method of claim 10, wherein said first branch provides an optical path length (OPL) of between 0.5 m and 50 m.

14. The method of claim 10, wherein said roundtrip attenuation is from −45 dB to −65 dB.

15. The method of claim 10, wherein said semiconductor laser comprises a single longitudinal mode (SLM) laser die, further comprising an optical isolator before said optical splitter.

16. The method of claim 10, wherein said semiconductor laser comprises a Distributed Feedback (DFB) laser or a Distributed Bragg Reflector (DBR) laser.

17. The method of claim 10, wherein said laser driver comprises a current source or a voltage source that is part of a laser controller including a temperature controller and a cooler, further comprising controlling a temperature of said semiconductor laser.

18. The method of claim 10, wherein said laser driver comprises an optical source.

19. The method of claim 10, wherein said semiconductor laser is a fiber coupled laser coupled to an output fiber.

20. The method of claim 10, wherein said semiconductor laser is a free space laser.

* * * * *